(12) United States Patent
Jeong et al.

(10) Patent No.: US 11,515,245 B2
(45) Date of Patent: Nov. 29, 2022

(54) METHOD FOR MANUFACTURING INSULATING LAYER FOR SEMICONDUCTOR PACKAGE AND INSULATING LAYER FOR SEMICONDUCTOR PACKAGE USING THE SAME

(71) Applicant: LG CHEM, LTD., Seoul (KR)

(72) Inventors: Minsu Jeong, Daejeon (KR); You Jin Kyung, Daejeon (KR); Byung Ju Choi, Daejeon (KR); Woo Jae Jeong, Daejeon (KR); Kwang Joo Lee, Daejeon (KR); Eunbyurl Cho, Daejeon (KR)

(73) Assignee: LG CHEM, LTD., Seoul (KR)

( * ) Notice: Subject to any disclaimer, the term of this patent is extended or adjusted under 35 U.S.C. 154(b) by 196 days.

(21) Appl. No.: 16/767,872

(22) PCT Filed: Dec. 12, 2018

(86) PCT No.: PCT/KR2018/016351
§ 371 (c)(1),
(2) Date: May 28, 2020

(87) PCT Pub. No.: WO2019/139274
PCT Pub. Date: Jul. 18, 2019

(65) Prior Publication Data
US 2020/0395288 A1    Dec. 17, 2020

(30) Foreign Application Priority Data

Jan. 10, 2018 (KR) .................. 10-2018-0003579

(51) Int. Cl.
*H01L 23/498* (2006.01)
*B29C 65/02* (2006.01)

(52) U.S. Cl.
CPC ........ *H01L 23/49894* (2013.01); *B29C 65/02* (2013.01)

(58) Field of Classification Search
CPC .................... H01L 23/49894; B29C 65/02
See application file for complete search history.

(56) References Cited

U.S. PATENT DOCUMENTS

| | | | |
|---|---|---|---|
| 2001/0055891 A1 | 12/2001 | Ko et al. | |
| 2003/0216058 A1 | 11/2003 | Ko et al. | |

(Continued)

FOREIGN PATENT DOCUMENTS

| | | | |
|---|---|---|---|
| JP | 2002-016057 A | 1/2002 | |
| JP | 2011-132541 A | 7/2011 | |

(Continued)

OTHER PUBLICATIONS

Extended European Search Report dated Nov. 11, 2020, of the corresponding European Patent Application No. 18900388.2, 9 pages.

(Continued)

*Primary Examiner* — Jeffry H Aftergut
*Assistant Examiner* — Jaeyun Lee
(74) *Attorney, Agent, or Firm* — Rothwell, Figg, Ernst & Manbeck, P.C.

(57) ABSTRACT

The present invention relates to a method for manufacturing an insulating layer for a semiconductor package which can improve reliability and have excellent heat resistance by removing pores generated in the insulating layer during manufacture of an insulating layer for a semiconductor package using magnetic characteristics, and an insulating layer for a semiconductor package obtained using the method for manufacturing the insulating layer for a semiconductor package.

14 Claims, 3 Drawing Sheets

(56) References Cited

U.S. PATENT DOCUMENTS

| | | |
|---|---|---|
| 2005/0287355 A1 | 12/2005 | Matayabas, Jr. |
| 2008/0115315 A1 | 5/2008 | White et al. |
| 2009/0091045 A1 | 4/2009 | Tanikawa et al. |
| 2009/0098359 A1 | 4/2009 | Waller et al. |
| 2009/0123642 A1* | 5/2009 | Sato .................. H05K 3/185 |
| | | 522/170 |
| 2009/0296364 A1 | 12/2009 | Yamamoto |
| 2010/0206806 A1 | 8/2010 | Waller et al. |
| 2013/0118975 A1 | 5/2013 | Waller, Jr. et al. |
| 2016/0309582 A1* | 10/2016 | Tomizawa ............ H05K 3/022 |
| 2017/0198182 A1 | 7/2017 | Kim et al. |
| 2017/0233610 A1 | 8/2017 | Kim et al. |

FOREIGN PATENT DOCUMENTS

| | | |
|---|---|---|
| JP | 2012-052059 A | 3/2012 |
| JP | 5204365 B2 | 6/2013 |
| JP | 2014-122337 A | 7/2014 |
| KR | 10-2004-0065460 A | 7/2004 |
| KR | 10-2010-0074270 A | 7/2010 |
| KR | 10-2012-0107373 A | 10/2012 |
| KR | 10-2012-0122389 A | 11/2012 |
| KR | 10-2014-0028249 A | 3/2014 |
| KR | 10-2016-0128936 A | 11/2016 |

OTHER PUBLICATIONS

Search Report issued for correspongin International Application PCT/KR2018/016351 dated Apr. 8, 2019, 4 pages.

* cited by examiner

[FIG. 1]
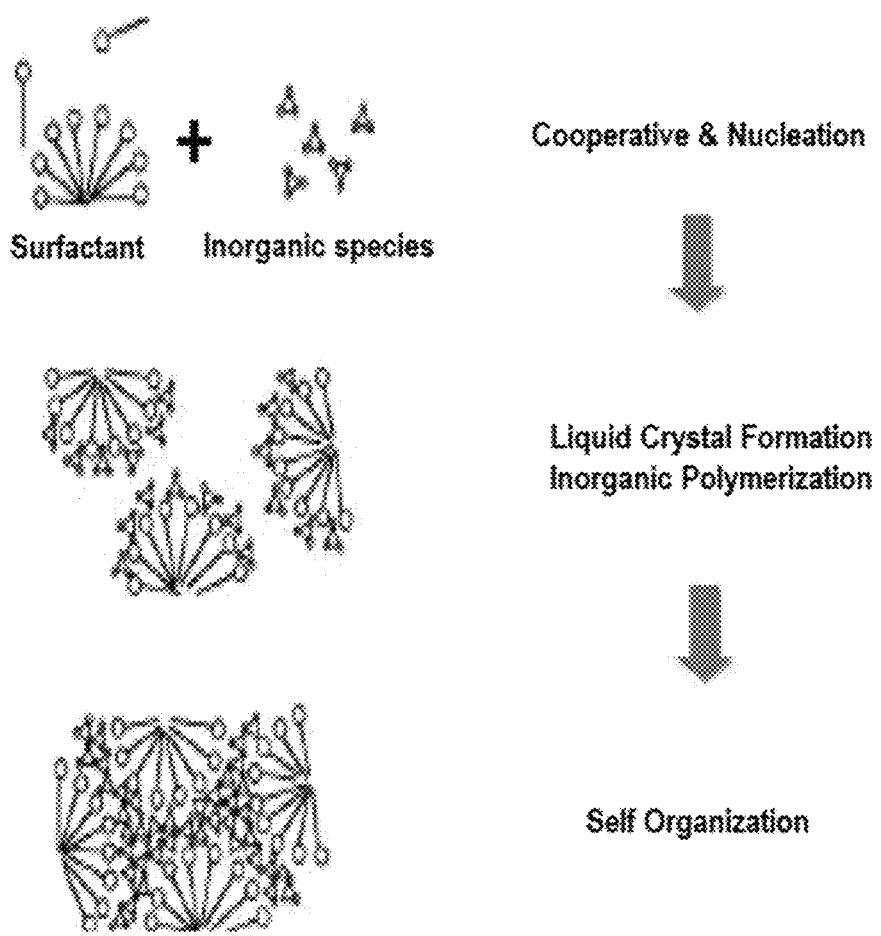

[FIG. 2]
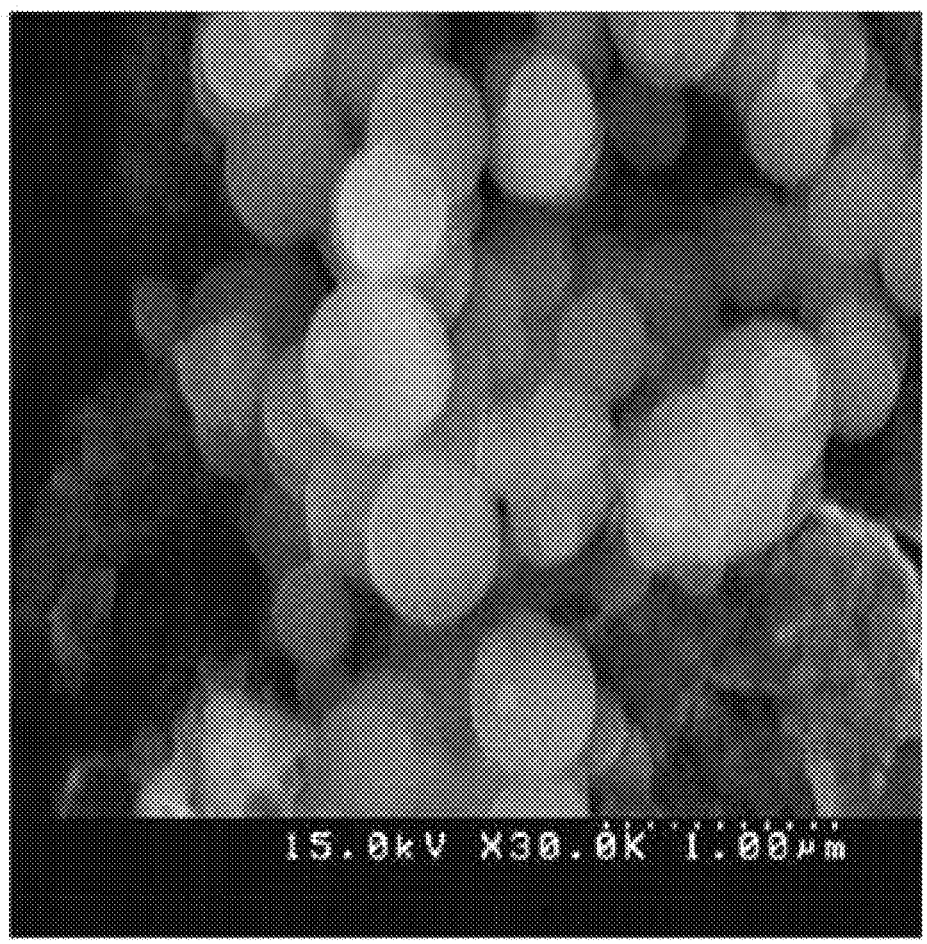

[FIG. 3]
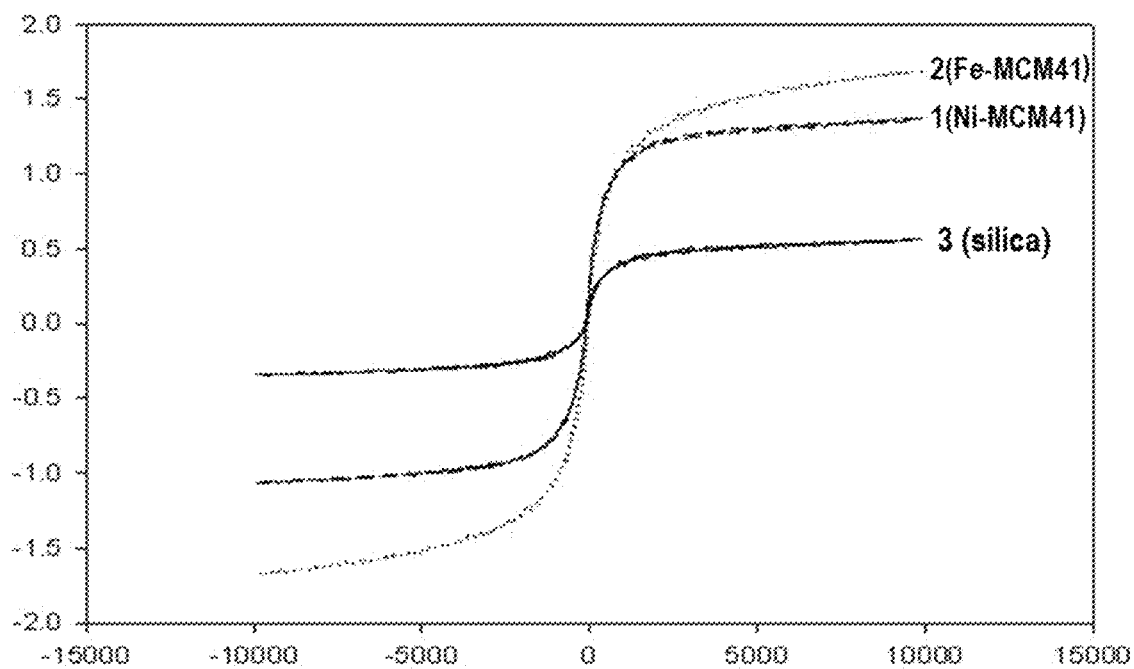

METHOD FOR MANUFACTURING INSULATING LAYER FOR SEMICONDUCTOR PACKAGE AND INSULATING LAYER FOR SEMICONDUCTOR PACKAGE USING THE SAME

CROSS-REFERENCE TO RELATED APPLICATION(S)

This application is a 35 U.S.C. 371 National Phase Entry Application from PCT/KR2018/016351 filed on Dec. 20, 2018, designating the United States and claims the benefits of the filing date of Korean Patent Application No. 10-2018-0003579 filed with Korean Intellectual Property Office on Jan. 10, 2018, the entire contents of which are incorporated herein by reference.

TECHNICAL FIELD

The present invention relates to a method for manufacturing an insulating layer for a semiconductor package, and an insulating layer for a semiconductor package formed using the method. More specifically, the present invention relates to a method for manufacturing an insulating layer for a semiconductor package which can improve reliability and have excellent heat resistance by removing pores generated in the insulating layer during manufacture of the insulating layer for a semiconductor package using magnetic characteristics, and an insulating layer for a semiconductor package obtained using such a method for manufacturing the insulating layer for a semiconductor package.

BACKGROUND OF THE INVENTION

In recent years, electronic devices have increasingly been miniaturized, weight-lightened, and highly functionalized. For this purpose, a single or a plurality of printed circuit boards (PCB), semiconductor package substrates, flexible semiconductor package (FPCB) substrates, and the like are included in the electronic devices.

When these printed circuit boards (PCB), semiconductor package substrates, flexible semiconductor package (FPCB) substrates, or the like are present in an exposed state inside the electronic devices, they may be damaged by physical contact with other accessories or by heat generated by the use of electronic devices, and in this case, reliability may be deteriorated.

To prevent these problems, an insulating layer is introduced as a protective film for preventing printed circuit boards (PCB), semiconductor package substrates, and flexible semiconductor package (FPCB) substrates from being exposed as they are.

In particular, when the insulating layer for a semiconductor package is used as the insulating layer, an insulating layer can be generally formed by coating, drying, and curing a resin composition containing a thermosetting resin, and the introduction of such an insulating layer for a semiconductor package allows it to secure high reliability in a multilayer printed circuit board and semiconductor packaging.

However, there is limitation in that during the process of manufacturing the insulating layer for a semiconductor package, fine voids are generated inside the insulating layer, and due to the pores, the reliability of the multilayer printed circuit board and the semiconductor packaging is lowered and the physical properties of the insulating layer itself are deteriorated.

Thus, there is a demand to develop a novel method for manufacturing an insulating layer for a semiconductor package which can improve reliability and have excellent heat resistance by effectively removing the pores generated in the insulating layer during manufacture of the insulating layer for a semiconductor package.

DETAILED DESCRIPTION OF THE INVENTION

The present invention provides a method for manufacturing an insulating layer for a semiconductor package which can improve reliability and have excellent heat resistance by removing the pores generated in the insulating layer during manufacture of the insulating layer for a semiconductor package using magnetic characteristics.

The present invention also provides an insulating layer for a semiconductor package obtained using the method for manufacturing the insulating layer for a semiconductor package.

An embodiment of the present invention provides a method for manufacturing an insulating layer for a semiconductor package, including: a first step of forming a thermosetting resin film containing a heat-curable binder resin, a heat curing catalyst, and 30% to 90% by weight of a metal grafting porous structure on a circuit board; and a second step of heat curing the thermosetting resin film, wherein in at least one of the first step and the second step, a magnetic field of 0.1 T to 1 T is applied to the thermosetting resin film.

Another embodiment of the present invention provides an insulating layer for a semiconductor package including a cured product of a thermosetting resin film containing a heat-curable binder resin, a heat curing catalyst, and 30% to 90% by weight of a metal grafting porous structure, wherein an average diameter of pores contained in the cured product of the thermosetting resin film is 1.0 µm or less.

A method for manufacturing an insulating layer for a semiconductor package and an insulating layer for a semiconductor package formed using the method according to specific embodiments of the present invention will be described in more detail below.

Throughout the specification, when one part "includes" one constituent element, unless otherwise specifically described, this does not mean that another constituent element is excluded, but means that another constituent element may be further included.

As used herein, the weight average molecular weight means a weight average molecular weight in terms of polystyrene measured by the GPC method. In the process of determining the weight average molecular weight in terms of polystyrene measured by the GPC method, a commonly known analyzing device, a detector such as a refractive index detector, and an analytical column can be used. Commonly applied conditions for temperature, solvent, and flow rate can be used. Specific examples of the measurement conditions are as follows: a Polymer Laboratories PLgel MIX-B, 300 mm column, Waters PL-GPC220 instrument is used at an evaluation temperature of 160° C., 1,2,4-trichlorobenzene is used as a solvent, the flow rate is 1 mL/min, a sample is prepared at a concentration of 10 mg/10 mL and then fed in an amount of 200 µL, and the value of Mw can be determined using calibration curves formed from a polystyrene standard. The molecular weight of the polystyrene standards is nine kinds of 2000/10,000/30,000/70,000/200,000/700,000/2,000,000/4,000,000/10,000,000.

1. Method for Manufacturing an Insulating Layer for a Semiconductor Package

According to an embodiment of the present invention, a method for manufacturing an insulating layer for a semiconductor package can be provided, including: a first step of forming a thermosetting resin film containing a heat-curable binder resin, a heat curing catalyst, and 30% to 90% by weight of a metal grafting porous structure on a circuit board; and a second step of heat curing the thermosetting resin film, wherein in at least one of the first step and the second step, a magnetic field of 0.1 T to 1 T is applied to the thermosetting resin film.

Specifically, according to the method for manufacturing an insulating layer for a semiconductor package of one embodiment, in the first step, a magnetic field of 0.1 T to 1 T may be applied to the thermosetting resin film, alternatively, in the second step, a magnetic field of 0.1 T to 1 T may be applied to the thermosetting resin film, and as a further alternative, in both the first step and the second step, a magnetic field of 0.1 T to 1 T may be applied to the thermosetting resin film.

Through continued experiments, the present inventors found that when a thermosetting resin film containing 30% to 90% by weight of a metal grafting porous structure is introduced as an insulating layer onto a circuit board, and a magnetic field of 0.1 T to 1 T is applied to the thermosetting resin film in a process of heat curing, that is, in a process step until being completely heat cured, a pore diameter remaining in the thermosetting resin film is reduced while the metal grafting porous structure contained in the thermosetting resin film vibrates in the magnetic field due to magnetic characteristics, and finally the pores can be completely removed or the occurrence of new pores can be suppressed, thereby improving the reliability of the finally obtained insulating layer. The present invention has been completed on the basis of such findings.

In particular, the metal grafting porous structure is not a simple additive, but is contained at a high content of 30% to 90% by weight based on the total weight of the thermosetting resin film, and thus can form a main component together with the thermosetting resin. Thus, a specific magnetic field within the above-described range is applied to the thermosetting resin film containing a high-content metal grafting porous structure, and thus the pore diameter is reduced to a sufficient level, and preferably, the pores can be completely removed so that the reliability of the insulating layer can be greatly improved.

In addition, since the metal grafting porous structure has a magnetic characteristic such that the frequency of the magnetic grafting porous structure roughly increases as the intensity of the magnetic field increases. Therefore, it was confirmed that the optimum pore removal efficiency can be exhibited when a sufficient magnetic field of 0.1 T to 1 T is applied.

The details of each step of the method for manufacturing an insulating layer for a semiconductor package of the present invention will be described below.

(1) First Step: Step of Forming a Thermosetting Resin Film Containing a Heat-Curable Binder Resin, a Heat Curing Catalyst, and 30 to 90% by Weight of a Metal Grafting Porous Structure on a Circuit Board The thermosetting resin film may include a heat-curable binder resin, a heat curing catalyst, and 30 to 90% by weight of a metal grafting porous structure on a circuit board.

The 'metal grafting porous structure' refers to a complex formed by adsorbing or physically/chemically bonding a certain metal onto an inorganic material in which many fine pores are formed.

As the metal grafting porous structure, a structure in which a metal is grafted to an inorganic material having a porous structure may be used. For example, a metal grafting porous structure known to be commonly used in a catalyst, a carrier of a catalyst, or an adsorbent can be used. Specifically, it is preferable that a structure in which the metal is grafted to a molecular sieve containing a silicate is used as the metal grafting porous structure. When such a silicate-containing molecular sieve is used, it is possible to secure a low linear expansion coefficient and excellent high-temperature stability.

The silicate-containing molecular sieve may include a zeolite, a silica molecular sieve in which fine pores are uniformly formed, or a mixture thereof.

Specific examples of the zeolite include mordenite, ferrierite, ZSM-5, β-zeolite, Ga-silicate, Ti-silicate, Fe-silicate or Mn-silicate, but the contents of the zeolite are not limited to the examples described above.

Further, the silica molecular sieve in which fine pores are uniformly formed means a silica molecular sieve in which pores having a diameter of several nanometers to several tens of nanometers or less (for example, a diameter of 1 nm to 30 nm) are uniformly formed, and specific examples thereof include MCM-22, MCM-41, MCM-48, and a mixture thereof.

Molecular sieves of MCM (mobile crystalline material) series were developed by Mobil Oil Corporation, USA. In particular, MCM-41 has a structure in which linear pores having a certain size on a silica plate form a hexagonal arrangement, that is, uniformly form channels in the form of a honeycomb. According to recent research results, it is known that MCM-41 is manufactured through a liquid crystal templating mechanism. That is, the surfactant forms a liquid crystal structure in an aqueous solution, silicate ions surround it, a conjugate between the surfactant and the MCM-41 material is formed via a hydrothermal reaction, and the surfactant is removed by calcination treatment at a temperature of 500° C. to 600° C. Thereby, MCM-41 can be obtained.

When a metal grafting porous structure in which a metal is grafted to a molecular sieve containing such a silicate is applied to a thermosetting resin film, it is possible to improve heat resistance stability, high temperature stability, or heat resistance reliability while allowing the film to have a hue.

On the other hand, as the metal to be grafted, it is possible to use metals that can exist as metal ions when hydrated, and preferably, one or more selected from the group consisting of nickel, copper, iron, and aluminum can be used. Further, in consideration of the color of the composition expressed by metal ions, as the metal grafting porous structure, one or more selected from the group consisting of Ni/MCM-41, Fe/MCM-41, and Cu/MCM-41 can be preferably used.

The 'Ni/MCM-41', 'Fe/MCM-41', and 'Cu/MCM-41' means those in which a metal such as nickel, iron, and copper is grafted to the molecular sieve including silicates of MCM-41, MCM-41, and MCM-41.

Further, the metal grafting porous structure is a structure in which pores having a diameter of several nanometers to several tens of nanometers or less are formed, and it may have a particle diameter of less than 1 μm. FIG. 2 is a scanning electron microscope (SEM) photograph of Ni/MCM-41 used in the examples.

Considering the degree of dispersion of the use stage or the storage steps of the thermosetting resin film, the metal grafting porous structure may have a particle diameter of 10 nm to 2000 nm, or a particle diameter of 100 nm to 600 nm.

On the other hand, as a method of grafting a metal to a molecular sieve such as zeolite, methods generally known to be used for a method of manufacturing a metal catalyst using zeolite or the like as a carrier can be used without particular limitation.

Methods for preparing molecular sieves of MCM series, such as MCM-22, MCM-41, and MCM-48, in addition to zeolite, can use commercially available substances, and can also be manufactured by the following method.

Specifically, the molecular sieves of MCM series can be manufactured through the steps of: adding a metal chloride to an alkyltrimethylammonium halide aqueous solution; adding ammonia water to the mixture and stirring the mixture; after the stirring, adding tetraethyl orthosilicate dropwise and then stirring the mixture; and calcinating the resulting mixture. The schematic contents of such a manufacturing method are shown in FIG. 1. As shown in FIG. 1, a nucleation reaction may proceed by adding a metal chloride to an alkyltrimethylammonium halide aqueous solution corresponding to a surfactant.

In the aforementioned manufacturing method, the alkyltrimethylammonium halide compound, which is conventionally known, can be used without particular limitation. For example, hexadecyltrimethylammonium bromide, dodecyltrimethylammonium bromide, tetradecyltrimethylammonium bromide, octadecyltrimethyl ammonium bromide, cetyltrimethylammonium chloride, myristyltrimethylammonium chloride, decyltrimethylammonium bromide, octyltrimethylammonium bromide, hexyltrimethylammonium bromide, and the like can be used.

In addition, the metal chloride can be selected in consideration of the kind of metal grafted to the silicate-containing molecular sieve. Specific examples of the metal chloride include nickel dichloride, ferrous chloride, ferric chloride, cuprous chloride, cupric chloride, or a mixture thereof.

Then, when ammonia water is added to the mixed solution containing the alkyltrimethylammonium halide and the metal chloride and then stirred, and further, tetraethyl orthosilicate is added dropwise and stirred, a molecular sieve precursor having a liquid crystal templating mechanism can be formed through a liquid crystal formation reaction and an inorganic crosslinking reaction as shown in FIG. 1. Finally, through calcination, the organic material of the molecular sieve precursor is blown off and a porous structure can be obtained.

On the other hand, it is preferable to add the metal chloride in an amount of 1 mol % to 30 mol % based on the total weight of the alkyltrimethyl ammonium halide solution including metal chloride in order to improve the reaction yield.

The calcination step is carried out at a temperature of 300° C. to 800° C. in order to incinerate and blow off the organic substances contained in the molecular sieve precursor.

The thermosetting resin film may contain 30% to 90% by weight, or 40% to 80% by weight, of the metal grafting porous structure based on the total weight of the thermosetting resin film. When the metal grafting porous structure is added in an amount of less than 30% by weight, or less than 40% by weight, it is difficult to sufficiently remove pores inside the thermosetting resin layer, so that the effect of improving the heat resistance reliability is poor, and the mechanical properties of the thermosetting resin film finally produced can also be deteriorated. When the metal grafting porous structure is contained in an excess amount exceeding 80% by weight, or more than 90% by weight, not only is the mechanical properties of the final product obtained from the composition deteriorated but also the processability may be lowered in the course of producing the film from the composition.

On the other hand, the heat-curable binder resin may be a thermosetting resin containing one or more functional groups selected from the group consisting of an epoxy group, an oxetanyl group, a cyclic ether group, and a cyclic thioether group. Such heat-curable binder resin can be heat cured through an epoxy curing agent or the like which is further applied to the thermosetting resin film.

On the other hand, when the heat-curable binder resin having a softening point of 70° C. to 100° C. is used, the irregularities may be minimized during lamination. When a heat-curable binder resin having a low softening point is used, the film tackiness is increased, and when a heat-curable binder resin having a high softening point is used, the flowability of the thermosetting resin film may be deteriorated.

A preferable example of the heat-curable binder resin may be a thermosetting resin having two or more cyclic ether groups and/or a cyclic thioether group (hereinafter referred to as a "cyclic (thio)ether group"). Of these, bifunctional epoxy resins are preferred. Alternatively, diisocyanate or its bifunctional block isocyanate may be used.

The heat-curable binder resin having two or more cyclic (thio)ether groups may be a compound having a 3-, 4-, or 5-membered cyclic ether group in the molecule, or a compound having two or more functional groups of one or two cyclic thioether groups.

Specifically, the heat-curable binder resin is a polyfunctional epoxy resin having at least two epoxy groups, a polyfunctional oxetane resin having at least two oxetanyl groups, or an episulfide resin having at least two thioether groups.

Specific examples of the polyfunctional epoxy resin include a bisphenol A type of epoxy resin, a hydrogenated bisphenol A type of epoxy resin, a brominated bisphenol A type of epoxy resin, a bisphenol F type of epoxy resin, a bisphenol S type of epoxy resin, a novolac type of epoxy resin, a phenol novolac type of epoxy resin, a cresol novolac type of epoxy resin, an N-glycidyl type of epoxy resin, a bisphenol-A type of novolac epoxy resin, a bixylenol type of epoxy resin, a bisphenol type of epoxy resin, a chelate type of epoxy resin, a glyoxal type of epoxy resin, an amino group-containing epoxy resin, a rubber-modified epoxy resin, a dicyclopentadiene phenolic epoxy resin, a diglycidyl phthalate resin, a heterocyclic epoxy resin, a tetraglycidyl xylenoyl ethane resin, a silicone-modified epoxy resin, an ε-caprolactone-modified epoxy resin, and the like. Further, in order to impart flame retardancy, an atom such as phosphorus (P) may be further introduced into the above-mentioned polyfunctional epoxy resin and used. Such a polyfunctional epoxy resin can improve properties such as adhesiveness of the cured film, resistance to soldering heat, resistance to electroless plating, and the like during heat curing. Further, as a commercially available product, YD-127 manufactured by Kukdo Chemical can be used.

Further, specific examples of the polyfunctional oxetane resin may include multifunctional oxetanes such as bis[(3-methyl-3-oxetanylmethoxy)methyl]ether, bis[(3-ethyl-3-oxetanylmethoxy)methyl]ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl)methyl acrylate, (3-ethyl-3-oxetanyl)methyl acrylate, (3-methyl-3- oxetanyl)methyl methacrylate, (3-ethyl-3-oxetanyl)methyl methacrylate, and oligomers or copolymers thereof, and etherificated products of oxetane alcohol and novolac resins, poly(p-hydroxystyrene), cardo type bisphenols, calixarenes, calixresorcinarenes, or resins having hydroxyl groups such as silsesquioxane, and the like. Furthermore, copolymers of an unsaturated monomer having an oxetane ring and an alkyl(meth)acrylate may also be included.

Meanwhile, examples of the multifunctional episulfide resins having two or more thioether groups may include YL7000 (bisphenol A type episulfide resin) manufactured by Japan Epoxy Resins Co., Ltd., and the like, but examples of usable resins are not limited thereto. Further, as a commercially available product, YDCN-500-80P manufactured by Kukdo Chemical can be used.

The thermosetting resin film may contain 1% to 65% by weight or 5% to 50% by weight of the heat-curable binder resin. When the content of the heat-curable binder resin is too small, a carboxyl group remains in the cured coating film, and thus heat resistance, alkali resistance, electrical insulation, and the like are deteriorated, which is not preferable. When the content of the heat-curable binder resin is too high, a low molecular weight cyclic (thio)ether group or the like remains in the dried coating film, and thus the strength or the like of the coating film is lowered, which is not preferable.

In addition, the heat curing catalyst serves to accelerate the curing of the heat-curable binder resin during heat curing.

As described above, since the thermosetting resin film according to one embodiment of the present invention may contain the heat-curable binder resin having two or more cyclic(thio)ether groups, it is possible to incorporate a heat curing catalyst. Examples of such heat curing catalyst may include imidazole compounds such as imidazole, 2-methylimidazole, 2-ethylimidazole, 2-ethyl-4-methylimidazole, 2-phenylimidazole, 4-phenylimidazole, 1-cyanoethyl-2-phenylimidazole, and 1-(2-cyanoethyl)-2-ethyl-4-methylimidazole; amine compounds such as dicyandiamide, benzyldimethylamine, 4-(dimethylamino)-N,N-dimethylbenzylamine, 4-methoxy-N,N-dimethylbenzylamine, and 4-methyl-N,N-dimethylbenzylamine; hydrazine compounds such as adipic acid dihydrazide and sebacic acid dihydrazide; phosphorus compounds such as triphenylphosphine; and the like.

Furthermore, examples of commercially available products may include 2MZ-A, 2MZ-OK, 2PHZ, 2P4BHZ, and 2P4 MHZ manufactured by Shikoku Chemical Corporation (all are trade names of imidazole compounds), U-CAT3503N and U-CAT3502T manufactured by San-Apro Ltd. (both are trade names of block isocyanate compounds of dimethylamine), DBU, DBN, U-CATSA102, and U-CAT5002 (all are bicyclic amidine compounds and salts thereof), and the like.

However, the usable heat curing catalysts are not limited to examples described above, and compounds known as heat curing catalysts of epoxy resins or oxetane compounds, or heat curing catalysts promoting the reaction between epoxy groups and/or oxetanyl groups and carboxyl groups, can be used without particular limitation.

Furthermore, guanamine, acetoguanamine, benzoguanamine, melamine, and S-triazine derivatives such as 2,4-diamino-6-methacryloyloxyethyl-S-triazine, 2-vinyl-4,6-diamino-S-triazine, and 2-vinyl-4,6-diamino-S-triazine-isocyanuric acid and 2,4-diamino-6-methacryloyloxyethyl-S-triazine-isocyanuric acid adducts can also be used.

The heat curing catalyst may be used in an appropriate amount in consideration of the degree of curing of the heat-curable binder resin. For example, the thermosetting resin film may contain 0.1% to 20% by weight of the heat curing catalyst.

The thermosetting resin film may further include pores having an average diameter of 1.2 μm or more, 1.5 μm to 5.0 μm, or 1.8 μm to 3.8 μm. The pores may occur in a process of forming a thermosetting film from a thermosetting resin composition or bonding a thermosetting film to a circuit board. Finally, when the pores are present in the insulating layer obtained through heat curing of the thermosetting resin film, there is a limit in that it is difficult for the insulating layer to have excellent reliability.

In addition, the thermosetting resin film may further include a pigment, an epoxy curing agent, a leveling agent, or a dispersant, as necessary.

The pigment exhibits visibility and hiding power, and as the pigment, red, blue, green, yellow, or black pigments and the like can be used. As the blue pigments, phthalocyanine blue, Pigment Blue 15:1, Pigment Blue 15:2, Pigment Blue 15:3, Pigment Blue 15:4, Pigment Blue 15:6, Pigment Blue 60, and the like can be used. As the green pigments, Pigment Green 7, Pigment Green 36, Solvent Green 3, Solvent Green 5, Solvent Green 20, Solvent Green 28, and the like can be used. The yellow pigments include anthraquinone types, isoindolinone types, condensed azo types, benzimidazolone types, and the like. For example, Pigment Yellow 108, Pigment Yellow 147, Pigment Yellow 151, Pigment Yellow 166, Pigment Yellow 181, Pigment Yellow 193, and the like can be used. As the red pigments, Pigment Red 254 and the like can be used. The content of the pigment is preferably 0.1% to 10% by weight, or 0.5% to 5% by weight, with respect to the total weight of the thermosetting resin film.

Types of the epoxy curing agent may include an amine compound, an acid anhydride compound, an amide compound, a phenol compound, or the like. The amine compound may include diaminodiphenylmethane, diethylenetriamine, triethylenetetramine, diaminodiphenylsulfone, isophorondiamine, and the like. The acid anhydride compound may include phthalic anhydride, trimellitic anhydride, pyromellitic anhydride, maleic anhydride, tetrahydrophthalic anhydride, methyltetrahydrophthalic anhydride, methylnadic anhydride, hexahydrophthalic anhydride, methylhexahydrophthalic anhydride, and the like. The amide compound may include dicyandiamide and a polyamide resin prepared from a dimer of linoleic acid and ethylene diamine. The phenol compound may include polyhydric phenols such as bisphenol A, bisphenol F, bisphenol S, fluorene bisphenol, and terpene diphenol; a phenol resin prepared from the condensation of phenols and aldehydes, ketones, or dienes; modified products of phenols and/or phenol resins; halogenated phenols such as tetrabromo bisphenol A and brominated phenol resin; and other imidazoles, BF3-amine complexes, and guanidine derivatives.

The epoxy curing agent can be used in an appropriate amount in consideration of the mechanical properties of the insulating film as prepared. For example, the thermosetting resin film can include the epoxy curing agent in an amount of 0.01% to 10% by weight, or 0.1% to 5% by weight.

The leveling agent takes a part in eliminating popping or a crater on the surface of the film during a film coating process. As the leveling agent, it is possible to use a silicone compound, a fluorine compound, and a polymeric compound, for example BYK-380N, BYK-307, BYK-378, BYK-350, and the like available from BYK-Chemie GmbH.

The leveling agent can be used in an appropriate amount in consideration of the surface characteristics of the insulating film as prepared. For example, the thermosetting resin film can include the leveling agent in an amount of 0.1% to 20% by weight, or 1% to 10% by weight. Using too small an amount of the leveling agent can only have an insignificant effect on the elimination of the popping or the crater, while using an excessively large amount of the leveling agent may cause a number of bubbles in the film.

Dispersants may be added for the purpose of enhancing the dispersion stability of the filler or the pigment. Examples of available dispersants include Disperbyk-110, Disperbyk-162, and Disperbyk-168, available from BYK-Chemie GmbH.

The dispersant can be used in an appropriate amount, taking into account the dispersibility of each component used in the thermosetting resin film. For example, the thermosetting resin film can include the dispersant in an amount of 0.1% to 30% by weight, or 1% to 20% by weight. When the added amount of the dispersant is too small, one cannot expect a sufficient level of dispersion. When an excessively large amount of the dispersant is added, the heat resistance and the reliability may be affected.

Meanwhile, in addition to the foregoing additives such as the filler, the leveling agent, and the dispersant, well-known additives including a silane coupling agent such as an imidazole-, thiazole-, or triazole-based compound; and/or a flame retardant such as a phosphorous flame retardant or an antimony flame retardant can be incorporated. Further, when such a silane coupling agent and/or flame retardant is added, it can be added in an amount of 0.01% to 30% by weight, or 0.1% to 20% by weight, based on the weight of the thermosetting resin film.

On the other hand, in the first step, the above-mentioned thermosetting resin film can be formed on the circuit board.

Examples of the circuit board include a printed circuit board (PCB), a semiconductor package substrate, and a flexible semiconductor package (FPCB) substrate, but are not limited thereto. Preferably, a semiconductor package substrate on which a semiconductor chip is mounted can be used.

When the semiconductor package substrate on which the semiconductor chip is mounted is used as the circuit board, the method of manufacturing an insulating layer for a semiconductor package of the above embodiment can be applied to a semiconductor packaging application. Specifically, an insulating layer for a semiconductor package can be manufactured.

Examples of the method of forming the thermosetting resin film on the circuit board are not particularly limited, but for example, it can be obtained through the steps of: applying a thermosetting resin composition containing a heat-curable binder resin, a heat curing catalyst, and 30% to 90% by weight of a metal grafting porous structure onto a circuit board and drying it to form a thermosetting resin film; and bonding a thermosetting film to a circuit board. The details of the heat-curable binder resin, the heat curing catalyst, and 30% to 90% by weight of the metal grafting porous structure contained in the thermosetting resin composition may include those described above for the thermosetting resin film.

In addition, the thermosetting resin composition may further include a pigment, an epoxy curing agent, a leveling agent, a dispersant, or a solvent, if necessary. The details of the pigment, the epoxy curing agent, and the leveling agent may include those described above for the thermosetting resin film.

The solvent can be used for the purpose of dissolving the thermosetting resin composition and imparting suitable viscosity for the application of the composition. As specific examples of the solvent, ketones such as methylethylketone, cyclohexanone, and the like; aromatic hydrocarbons such as toluene, xylene, tetramethylbenzene, and the like; glycol ethers (cellosolves) such as ethylene glycol monoethylether, ethylene glycol monomethylether, ethylene glycol monobutylether, diethylene glycol monoethylether, diethylene glycol monomethylether, diethylene glycol monobutylether, propylene glycol monomethylether, propylene glycol monoethylether, dipropylene glycol diethylether, triethylene glycol monoethylether, and the like; acetic acid esters such as ethyl acetate, butyl acetate, ethylene glycol monoethylether acetate, ethylene glycol monobutylether acetate, diethylene glycol monoethylether acetate, dipropylene glycol monomethylether acetate, and the like; alcohols such as ethanol, propanol, ethylene glycol, propylene glycol, carbitol, and the like; aliphatic hydrocarbons such as octane, decane, and the like; petroleum solvents such as petroleum ether, petroleum naphtha, hydrogenated petroleum naphtha, solvent naphtha, and the like; and amides such as dimethyl acetamide, dimethylformamide (DMF), and the like, may be mentioned. The solvent may be used alone or in combination of two or more thereof.

The solvent may be used in an appropriate amount in consideration of the dispersibility, the solubility, or the viscosity of the thermosetting resin composition. For example, the thermosetting resin composition can include the solvent in an amount of 0.1% to 50% by weight, or 1% to 30% by weight. When the amount of the solvent is too small, it may increase the viscosity of the thermosetting resin composition, leading to a lowered coating ability. When the amount of the solvent is too large, it may cause difficulties in a solvent drying process, leading to increased tackiness of the formed film.

More specifically, in an example of the method of forming the thermosetting resin film on the circuit board, the above-mentioned thermosetting resin composition can be coated onto a carrier film such as PET, and then dried through a drying device such as an oven to produce a multilayer film composed of a carrier film and a thermosetting resin film from below.

In the coating step, conventional methods and devices known to be usable for applying the thermosetting resin composition can be used. For example, a comma coater, a blade coater, a lip coater, a rod coater, a squeeze coater, a reverse coater, a transfer roll coater, a gravure coater, a spray coater, or the like can be used.

The thickness of the thermosetting resin film may be 5 μm to 500 μm, or 10 μm to 200 μm.

As the carrier film, plastic films such as polyethylene terephthalate (PET), a polyester film, a polyimide film, a polyamideimide film, a polypropylene film, a polystyrene film, or the like can be used.

The drying temperature in the oven may be 50° C. to 130° C., or 70° C. to 100° C.

In the step of bonding the thermosetting resin film to the circuit board, a method in which a carrier film is peeled off and a thermosetting resin film is vacuum laminated on a substrate on which a circuit is formed can be used. For the vacuum lamination, bonding can be performed using a vacuum laminator, a hot roll laminator, a vacuum press, or the like.

On the other hand, in the step of forming a thermosetting resin film on the circuit board, specifically, in the step of bonding the thermosetting resin film to the circuit board, a magnetic field of 0.1 T to 1 T, 0.3 T to 0.8 T, or 0.5 T to 0.6 T can be applied to the thermosetting resin film. Consequently, while the metal grafting porous structure contained in the thermosetting resin film, which has not been cured, vibrates in the magnetic field due to magnetic characteristics, the pores remaining in the thermosetting resin film can be removed or the occurrence of new pores can be suppressed, and thereby the reliability of the insulating layer finally obtained can be improved.

An example of a method of applying a magnetic field into the thermosetting resin film is not particularly limited. For example, an N pole electromagnet is disposed on one surface of the thermosetting resin film and an S pole electromagnet is disposed on the surface opposite to the one surface of the thermosetting resin film. Thereby, the magnetic field can be applied while adjusting its intensity according to the current applied to the electromagnet.

In the first step of forming the thermosetting resin film on the circuit board, when a magnetic field of less than 0.1 T is applied to the thermosetting resin film, the vibration of the metal grafting porous structure is not sufficiently generated in the thermosetting resin film, and thus the efficiency of removing pores in the film may be reduced.

Further, in the first step of forming the thermosetting resin film on the circuit board, when an excessive magnetic field exceeding 1 T is applied to the thermosetting resin film, the magnetism of the metal grafting porous structure in the thermosetting resin film has already reached a saturation state as shown in FIG. 3, and thus the frequency of the grafting porous structure is not greatly improved so that the process efficiency due to the use of excessive power is reduced. Further, there is a fear of affecting the semiconductor chip mounted on the circuit board due to excessive magnetic field application.

On the other hand, when a magnetic field of 0.1 T to 1 T is applied to the thermosetting resin film, the Moment/Mass measurement value (measured by VSM) of the metal grafting porous structure contained in the thermosetting resin film may be 0.6 emu/g to 2.0 emu/g, or 0.7 emu/g to 1.8 emu/g. When the Moment/Mass measurement value (measured by VSM) of the metal grafting porous structure contained in the thermosetting resin film is reduced to less than 0.6 emu/g, the vibration of the metal grafting porous structure may not be sufficiently generated in the thermosetting resin film and thus the efficiency of removing pores in the film may be reduced.

On the other hand, after a magnetic field of 0.1 T to 1 T is applied to the thermosetting resin film, the average diameter of the pores contained in the thermosetting resin film may be reduced to 1 μm or less, 0 μm to 1 μm, or 0 μm to 0.7 μm. The average diameter of the pores being 0 μm may mean a pore-free state. This appears to result from the removal of pores or the suppression of pore generation by the vibration of the metal grafting porous structure contained in the thermosetting resin film due to the application of the magnetic field.

(2) Second Step: Step of Heat Curing the Thermosetting Resin Film

A step of heat curing the thermosetting resin film can be included after the first step of forming a thermosetting resin film including the heat-curable binder resin, the heat curing catalyst, and 30% to 90% by weight of the metal grafting porous structure on the circuit board.

Examples of the heat curing conditions are not particularly limited, and for example, the film can be heat cured in an oven at 140° C. to 200° C. for about 0.5 to 2 hours.

In the step of heat curing the thermosetting resin film, a step of removing the carrier film or the release film adhered to the thermosetting resin film may be included, if necessary.

Meanwhile, in the step of heat curing the thermosetting resin film, a magnetic field of 0.1 T to 1 T, 0.3 T to 0.8 T, or 0.5 T to 0.6 T can be applied to the thermosetting resin film. Consequently, while the metal grafting porous structure contained in the thermosetting resin film, which has not been cured, vibrates in the magnetic field due to magnetic characteristics, the pores remaining in the thermosetting resin film are removed or the occurrence of new pores is suppressed, and thereby the reliability of the insulating layer finally obtained can be improved.

An example of a method of applying a magnetic field into the thermosetting resin film is not particularly limited. For example, an N pole electromagnet is disposed on one surface of the thermosetting resin film, and an S pole electromagnet is disposed on the surface opposite to the one surface of the thermosetting resin film. Thereby, the magnetic field can be applied while adjusting its intensity according to the current applied to the electromagnet.

In the second step of heat curing the thermosetting resin film, when a magnetic field of less than 0.1 T is applied to the thermosetting resin film, the vibration of the metal grafting porous structure is not sufficiently generated in the thermosetting resin film, and thus the efficiency of removing pores in the film may be reduced.

Further, in the second step of heat curing the thermosetting resin film, when an excessive magnetic field exceeding 1 T is applied to the thermosetting resin film, the magnetism of the metal grafting porous structure in the thermosetting resin film has already reached a saturation state as shown in FIG. 3, and thus the frequency of the grafting porous structure is not greatly improved so that the process efficiency due to the use of excessive power is reduced. Further, there is a fear of affecting the semiconductor chip mounted on the circuit board due to excessive magnetic field application.

On the other hand, when applying a magnetic field of 0.1 T to 1 T to the thermosetting resin film, a Moment/Mass measurement value (measured by VSM) of the metal grafting porous structure contained in the thermosetting resin film may be 0.6 emu/g to 2.0 emu/g, or 0.7 emu/g to 1.8 emu/g. When the Moment/Mass measurement value (measured by VSM) of the metal grafting porous structure contained in the thermosetting resin film is reduced to less than 0.6 emu/g, the vibration of the metal grafting porous structure may not be sufficiently generated in the thermosetting resin film and thus the efficiency of removing pores in the film may be reduced.

On the other hand, after applying a magnetic field of 0.1 T to 1 T to the thermosetting resin film, the average diameter of the pores contained in the thermosetting resin film may be reduced to 1 μm or less, 0 μm to 1 μm, or 0 μm to 0.7 μm. The average diameter of the pores being 0 μm may mean a pore-free state. This appears to result from the removal of pores or the suppression of pore generation by the vibration of the metal grafting porous structure contained in the thermosetting resin film due to the application of the magnetic field.

2. Insulating Layer for Semiconductor Package

On the other hand, according to the present invention, an insulating layer for a semiconductor package including a cured product of a thermosetting resin film containing a heat-curable binder resin, a heat curing catalyst, and 30% to 90% by weight of a metal grafting porous structure can be provided, wherein an average diameter of pores contained in the cured product of the thermosetting resin film is 1 μm or less.

The details of the thermosetting resin film containing the heat-curable binder resin, the heat curing catalyst, and 30% to 90% by weight of the metal grafting porous structure include those described above in the one embodiment.

The cured product of a thermosetting resin film means a fully cured film obtained through the heat curing process of the thermosetting resin film. Examples of the heat curing conditions are not particularly limited, and for example, it can be heat cured in an oven at 140° C. to 200° C. for about 0.5 to 2 hours.

That is, the insulating layer for a semiconductor package according to another embodiment may be obtained by the method for manufacturing an insulating layer for a semiconductor package according to the embodiment described above.

Meanwhile, the average diameter of pores contained in the cured product of the thermosetting resin film may be 1 μm or less, 0 μm to 1 μm, or 0 μm to 0.7 μm. The average diameter of the pores being 0 μm may mean a pore-free state. This appears to result from the removal of pores or the suppression of pore generation by vibration of the metal grafting porous structure contained in the thermosetting resin film due to the application of the magnetic field in the method for manufacturing an insulating layer for a semiconductor package.

The insulating layer for a semiconductor package according to another embodiment may exist in a state of being laminated on a circuit board. The circuit board may include a printed circuit board (PCB), a semiconductor package substrate, a flexible semiconductor package (FPCB) substrate, or the like, but is not limited thereto. Preferably, a semiconductor package substrate on which a semiconductor chip is mounted can be mentioned.

That is, the insulating layer for a semiconductor package according to another embodiment of the present invention can be applied for a multilayer printed circuit board, a semiconductor package, and a flexible semiconductor package. In particular, in the semiconductor package including the insulating layer for a semiconductor package of the other embodiment, the semiconductor package may include an insulating layer for a semiconductor package laminated on a semiconductor package substrate. The semiconductor package substrate may be a semiconductor package substrate on which a semiconductor chip is mounted.

Advantageous Effects

According to the present invention, a method for manufacturing an insulating layer for a semiconductor package which can improve reliability and have excellent heat resistance by removing pores generated in the insulating layer during manufacture of the insulating layer for a semiconductor package using a magnetic characteristic, and an insulating layer for a semiconductor package obtained using the method for manufacturing an insulating layer for a semiconductor package, may be provided.

BRIEF DESCRIPTION OF DRAWINGS

FIG. 1 is a simplified illustration of a process for preparing a silicate-containing molecular sieve according to one embodiment of the present invention.

FIG. 2 is a scanning electron microscope image of Ni/MCM-41 prepared according to an embodiment of the present invention.

FIG. 3 shows VSM analysis results of the insulating films of Examples 1 and 2 of the present invention and a reference example.

DETAILED DESCRIPTION OF THE EMBODIMENTS

Below, the function and effect of the present invention will be described in more detail by way of examples. However, these examples are provided for illustrative purposes only, and should not be construed as limiting the scope of the present invention to these examples.

[EXAMPLE] MANUFACTURE OF THERMOSETTING INSULATING FILM AND SEMICONDUCTOR PACKAGE

Example 1

(1) Manufacture of Insulating Film for Semiconductor Package

The respective components were mixed using 35 wt % of YD-127 (KUKDO Chemical) as a heat-curable binder, 40 wt % of a metal grafting porous structure Ni/MCM-41 as a filler, 5 wt % of 2-phenylimidazole as a heat curing catalyst, 3 wt % of a leveling agent as a coating additive, and 17 wt % of PGMEA as a solvent, and then the mixture was stirred and dispersed with a three-roll mill device to prepare a thermosetting resin composition.

The thermosetting resin composition thus prepared was coated onto PET used as a carrier film using a comma coater, and then dried through an oven at 110° C. for 4 to 5 minutes to manufacture an insulating film (thickness of 100 μm) in which a carrier film was laminated.

(2) Manufacture of Semiconductor Package

The insulating film manufactured above was vacuum laminated on a semiconductor package substrate on which a semiconductor chip was mounted with a vacuum laminator (MV LP-500, manufactured by Meiki Seisakusho Co., Ltd.) to remove a carrier film. A magnetic field of 0.5 T was applied to the insulating film using a magnetic field application device to vibrate the Ni/MCM-41. Thereafter, by heating and curing at 180° C. for 1 hour, a semiconductor package including an insulating layer was manufactured.

The semiconductor package substrate on which the semiconductor chip was mounted used that in which a copper clad laminate (CCL), LG-T-500GA, of LG Chem. Ltd., having a thickness of 0.1 mm and a copper thickness of 12 μm was cut into a substrate of 5 cm in width and 5 cm in length and the semiconductor chip was mounted on the surface.

Example 2

(1) Manufacture of Insulating Film for Semiconductor Package

A thermosetting resin composition and an insulating film were manufactured in the same manner as in Example 1, except that Fe/MCM-41 was used instead of Ni/MCM-41 as the metal grafting porous structure.

(2) Manufacture of Semiconductor Package

A semiconductor package including an insulating layer was completed in the same manner as in Example 1, except that the insulating film manufactured as above was used.

Example 3

(1) Manufacture of Insulating Film for Semiconductor Package

A thermosetting resin composition and an insulating film were manufactured in the same manner as in Example 1, except for using 5 wt % of YD-127 (KUKDO Chemical) as a heat-curable binder, 80 wt % of a metal grafting porous structure Ni/MCM-41 as a filler, 5 wt % of 2-phenylimidazole as a heat curing catalyst, 3 wt % of a leveling agent as a coating additive, and 7 wt % of PGMEA as a solvent.

(2) Manufacture of Semiconductor Package

A semiconductor package including an insulating layer was completed in the same manner as in Example 1, except that the insulating film manufactured as above was used.

Example 4

(1) Manufacture of Insulating Film for Semiconductor Package

A thermosetting resin composition and an insulating film were manufactured in the same manner as in Example 1.

(2) Manufacture of Semiconductor Package

A semiconductor package including an insulating layer was completed in the same manner as in Example 1, except that a magnetic field of 0.6 T was applied to the insulating film.

Example 5

(1) Manufacture of Insulating Film for Semiconductor Package

A thermosetting resin composition and an insulating film were manufactured in the same manner as in Example 1.

(2) Manufacture of Semiconductor Package

The prepared insulating film was vacuum laminated on a semiconductor package substrate on which a semiconductor chip was mounted with a vacuum laminator (MV LP-500, manufactured by Meiki Seisakusho Co., Ltd.). Then, while heating and curing at 180° C. for 1 hour, a magnetic field of 0.5 T was applied to the insulating film using a magnetic field application device to vibrate the Ni/MCM-41. Thereby, a semiconductor package including an insulating layer was manufactured.

Example 6

(1) Manufacture of Insulating Film for Semiconductor Package

A thermosetting resin composition and an insulating film were manufactured in the same manner as in Example 5, except that Fe/MCM-41 was used instead of Ni/MCM-41 as the metal grafting porous structure.

(2) Manufacture of Semiconductor Package

A semiconductor package including an insulating layer was completed in the same manner as in Example 5, except that the insulating film manufactured above was used.

Example 7

(1) Manufacture of Insulating Film for Semiconductor Package

A thermosetting resin composition and an insulating film were manufactured in the same manner as in Example 5, except for using 5 wt % of YD-127 (KUKDO Chemical) as a heat-curable binder, 80 wt % of a metal grafting porous structure Ni/MCM-41 as a filler, 5 wt % of 2-phenylimidazole as a heat curing catalyst, 3 wt % of a leveling agent as a coating additive, and 7 wt % of PGMEA as a solvent.

(2) Manufacture of Semiconductor Package

A semiconductor package including an insulating layer was completed in the same manner as in Example 5, except that the insulating film manufactured as above was used.

Example 8

(1) Manufacture of Insulating Film for Semiconductor Package

A thermosetting resin composition and an insulating film were manufactured in the same manner as in Example 5.

(2) Manufacture of Semiconductor Package

A semiconductor package including an insulating layer was completed in the same manner as in Example 5, except that a magnetic field of 0.6 T was applied to the insulating film.

[COMPARATIVE EXAMPLE] MANUFACTURE OF THERMOSETTING INSULATING FILM AND SEMICONDUCTOR PACKAGE

Comparative Example 1

A semiconductor package including an insulating layer was completed in the same manner as in Example 1, except that a magnetic field of 0.04 T was applied to the insulating film in Example 1.

Comparative Example 2

A semiconductor package including an insulating layer was completed in the same manner as in Example 1, except for using 56.5 wt % of YD-127 (KUKDO Chemical) as a heat-curable binder, 18.5 wt % of a metal grafting porous structure Ni/MCM-41 as a filler, 5 wt % of 2-phenylimidazole as a heat curing catalyst, 3 wt % of a leveling agent as a coating additive, and 17 wt % of PGMEA as a solvent.

Comparative Example 3

A semiconductor package including an insulating layer was completed in the same manner as in Example 5, except that a magnetic field of 0.04 T was applied to the insulating film in Example 5.

Comparative Example 4

A semiconductor package including an insulating layer was completed in the same manner as in Example 5, except for using 56.5 wt % of YD-127 (KUKDO Chemical) as a heat-curable binder, 18.5 wt % of a metal grafting porous structure Ni/MCM-41 as a filler, 5 wt % of 2-phenylimidazole as a heat curing catalyst, 3 wt % of a leveling agent as a coating additive, and 17 wt % of PGMEA as a solvent.

Test Example

With respect to the insulating film for a semiconductor package or the insulating layer contained in the semiconductor package manufactured in Examples 1 to 8 and Comparative Examples 1 to 4, a magnetic characteristic, internal pore characteristic, and reliability were evaluated, and the results are shown in Table 1 below.

1. Measurement Method of Magnetic Characteristic

With respect to Ni/MCM-41 and Fe/MCM-41 respectively contained in the insulating films obtained in Examples 1 and 2, a curve satisfying magnetic field intensity (gauss) on the X axis and Moment/Mass (emu/g) on the Y axis was derived using a vibration sample magnetometer (VSM), and the results are shown in FIG. 3. In addition, the VSM curve for silica as a reference example is shown together therewith in FIG. 3.

Specifically, in FIG. 3, the VSM curve of Ni/MCM-41 contained in the insulating film obtained in Example 1 is the first curve, the VSM curve of Fe/MCM-41 contained in the insulating film obtained in Example 2 is the second curve, and the VSM curve of the silica contained in the insulating film obtained in the reference example is the third curve.

2. Measurement Method of Internal Pore Characteristic (1) Presence or Absence of Pores For the insulating films and the insulating layer contained in the semiconductor package obtained in Examples 1 to 8 and Comparative Examples 1 to 4, nondestructive testing was conducted according to a SAT (Scanning Acoustic Tomography) method using SONIX Quantum 350 Scanning Acoustic Microscopy equipment, and the presence or absence of pores was evaluated according to the following criteria.

OK: Absence of pores
NG: Presence of pores (2) Pore Diameter

For the insulating layers contained in the insulating films and the semiconductor packages obtained in Examples 1 to 8 and Comparative Examples 1 to 4, the average diameter of inner pores was measured through an FE-SEM (Hitachi, S-4800), and the results are shown in Table 1 below. The average diameter of the pores was obtained by finding the maximum diameter of each of the plurality of pores and then calculating the average value thereof.

3. Evaluation of Heat Resistance Reliability

The semiconductor package specimens obtained in Examples 1 to 8 and Comparative Examples 1 to 4 were allowed to stand in a pressure cooker test chamber at 146° C. and 100% RH for 24 hours, and then taken out to remove moisture on the surface. The test sample was made to float in a lead bath set at 288° C. with its film side facing upward. The appearance of the test sample was examined to determine whether the film was peeled or deformed, and the heat resistance reliability was evaluated.

OK: No bursting at 288° C. solder floating
NG: Bursting at 288° C. solder floating The measurement results of Experimental Examples 2 to 3 are shown in Table 1 below.

TABLE 1

Measurement results of Experimental Examples 2 and 3

Presence or absence of pores/Pore average diameter(unit: μm)

| Category | Insulating film (before applying magnetic field) | Insulating layer contained in semi-conductor package (after applying magnetic field) | Reliability |
|---|---|---|---|
| Example 1 | NG/2.4 | OK | OK |
| Example 2 | NG/2.7 | OK | OK |
| Example 3 | NG/3.4 | OK | OK |
| Example 4 | NG/2.4 | OK | OK |
| Example 5 | NG/2.1 | NG/0.65 | OK |
| Example 6 | NG/2.6 | OK | OK |
| Example 7 | NG/3.8 | OK | OK |
| Example 8 | NG/1.8 | OK | OK |
| Comparative Example 1 | NG/2.7 | NG/2.5 | NG |
| Comparative Example 2 | NG/1.4 | NG/1.5 | NG |
| Comparative Example 3 | NG/2.9 | NG/2.5 | NG |
| Comparative Example 4 | NG/1.6 | NG/1.5 | NG |

As shown in Table 1, it was confirmed that in the manufacturing method of the insulating layers of Examples 1 to 8, as a magnetic field of 0.5 T to 0.6 T was applied during the production of the film from a composition containing 30 wt % to 90 wt % of a metal grafting porous structure, all pores were removed after applying the magnetic field, or the average diameter of the remaining pores became very low at the level of 0.65 μm, and thus the decrease in reliability due to pore could be minimized.

On the other hand, when the magnetic field intensity was lowered to 0.04 T as in Comparative Example 1 and Comparative Example 3, the average diameter of the pores remaining after applying magnetic field was 2.5 μm, which was higher than that of the examples. As the volume ratio of the pores was relatively increased, the result of the reliability evaluation of the insulating layer was very poor.

In addition, when the content of the grafting porous structure was lowered to 18.5% by weight as in Comparative Example 2 and Comparative Example 4, the average diameter of the pores remaining after applying the magnetic field was 1.5 μm, which was higher than that of the examples. As the volume ratio of the pores was relatively increased, the result of the reliability evaluation of the insulating layer was very poor.

The invention claimed is:

1. A method for manufacturing an insulating layer for a semiconductor package comprising the steps of:
   a first step of forming, on a circuit board, a thermosetting resin film containing a heat-curable binder resin, a heat curing catalyst, and 30% to 90% by weight of a metal grafting porous structure based on the total weight of the thermosetting resin film; and
   a second step of heat curing the thermosetting resin film to prepare the insulating layer on the circuit board,
   wherein in at least one of the first step and the second step, a magnetic field of 0.1 T to 1 T is applied to the thermosetting resin film.

2. The method for manufacturing an insulating layer for a semiconductor package according to claim 1, wherein, when the magnetic field of 0.1 T to 1 T is applied to the thermosetting resin film, the metal grafting porous structure contained in the thermosetting resin film has a Moment/Mass measurement value of 0.6 emu/g to 2.0 emu/g as measured using a vibration sample magnetometer.

3. The method for manufacturing an insulating layer for a semiconductor package according to claim 1, wherein the thermosetting resin film further includes pores having an average diameter of 1.2 µm or more before the magnetic field of 0.1 T to 1 T is applied to the thermosetting resin film.

4. The method for manufacturing an insulating layer for a semiconductor package according to claim 1, wherein the thermosetting resin film includes pores having an average diameter of 1 µm or less after the magnetic field of 0.1 T to 1 T is applied to the thermosetting resin film.

5. The method for manufacturing an insulating layer for a semiconductor package according to claim 1, wherein the metal grafting porous structure is a structure having a metal grafted to a molecular sieve containing silicate.

6. The method for manufacturing an insulating layer for a semiconductor package according to claim 5, wherein the molecular sieve containing silicate includes a zeolite, a silica molecular sieve having fine pores uniformly formed or a mixture thereof.

7. The method for manufacturing an insulating layer for a semiconductor package according to claim 6, wherein the zeolite is one or more selected from the group consisting of mordenite, ferrierite, ZSM-5, β-zeolite, Ga-silicate, Ti-silicate, Fe-silicate, and Mn-silicate.

8. The method for manufacturing an insulating layer for a semiconductor package according to claim 6, wherein the silica molecular sieve includes one or more selected from the group consisting of MCM-22, MCM-41, and MCM-48.

9. The method for manufacturing an insulating layer for a semiconductor package according to claim 5, wherein the metal is one or more selected from the group consisting of nickel, copper, iron, and aluminum.

10. The method for manufacturing an insulating layer for a semiconductor package according to claim 1, wherein the metal grafting porous structure includes a structure having a metal grafted to a silica molecular sieve in which fine pores having a diameter of 1 nm to 30 nm are uniformed formed.

11. The method for manufacturing an insulating layer for a semiconductor package according to claim 1, wherein the metal grafting porous structure is one or more selected from the group consisting of Ni/MCM-41, Fe/MCM-41, and Cu/MCM-41.

12. The method for manufacturing an insulating layer for a semiconductor package according to claim 1, wherein the metal grafting porous structure has a particle diameter of 1 µm or less.

13. The method for manufacturing an insulating layer for a semiconductor package according to claim 1, wherein the thermosetting resin film contains 1% to 65% by weight of the heat-curable binder resin, and 0.1% to 20% by weight of the heat curing catalyst based on the total weight of the thermosetting resin film.

14. The method for manufacturing an insulating layer for a semiconductor package according to claim 1, wherein the heat-curable binder resin is a thermosetting resin containing one or more functional groups selected from the group consisting of an epoxy group, an oxetanyl group, a cyclic ether group, and a cyclic thioether group.

* * * * *